United States Patent [19]

Pelletier

[11] Patent Number: 5,666,023
[45] Date of Patent: Sep. 9, 1997

[54] DEVICE FOR PRODUCING A PLASMA, ENABLING MICROWAVE PROPAGATION AND ABSORPTION ZONES TO BE DISSOCIATED HAVING AT LEAST TWO PARALLEL APPLICATORS DEFINING A PROPOGATION ZONE AND AN EXCITER PLACED RELATIVE TO THE APPLICATOR

[75] Inventor: Jacques Pelletier, Saint Martin d'Heres, France

[73] Assignee: Société Responabilité Limité, Metal Process, Montevrain, France

[21] Appl. No.: 552,306

[22] Filed: Nov. 2, 1995

[30] Foreign Application Priority Data

Nov. 4, 1994 [FR] France ................... 94 13499

[51] Int. Cl.⁶ ........................................ H05H 1/46
[52] U.S. Cl. .................. 313/359.1; 313/251.31; 313/231.01; 315/111.21; 315/111.71; 204/298.38
[58] Field of Search ..................... 313/154, 155, 313/156, 161, 162, 359.1, 360.1, 362.1, 361.1, 231.31, 231.01; 315/111.21, 111.41, 111.71, 111.81; 250/423 R; 204/298.38

[56] References Cited

U.S. PATENT DOCUMENTS 5,111,111  5/1992  Stevens et al. ............ 315/111.21

5,227,695  7/1993  Pelletier et al. ........... 315/111.21

FOREIGN PATENT DOCUMENTS

| 0 209 469 A1 | 1/1987 | European Pat. Off. . |
| 0 402 282 A3 | 12/1990 | European Pat. Off. . |
| 0 496 681 A1 | 7/1992 | European Pat. Off. . |
| 0 613 329 A1 | 8/1994 | European Pat. Off. . |
| 2 583 250 | 12/1986 | France . |
| 2 671 931 | 7/1992 | France . |

Primary Examiner—Sandra L. O'Shea
Assistant Examiner—J. M. Patidar
Attorney, Agent, or Firm—Bacon & Thomas

[57] ABSTRACT

The invention relates to a distribution device for distributing microwave power to excite a plasma inside an enclosure. According to the invention, the distribution device includes at least one second applicator of microwave energy to co-operate with a first applicator and an exciter to form at least one excitation triplet in which firstly the first applicator and the second applicator are mounted substantially parallel to each other and are spaced apart by a given amount to define between them a propagation zone for microwave energy, and secondly the exciter is disposed inside the enclosure by being placed relative to the first and second applicators in such a manner that the trajectories of the electrons do not cross the propagation zone, thereby dissociating the propagation zone and the absorption zone.

13 Claims, 4 Drawing Sheets

DEVICE FOR PRODUCING A PLASMA, ENABLING MICROWAVE PROPAGATION AND ABSORPTION ZONES TO BE DISSOCIATED HAVING AT LEAST TWO PARALLEL APPLICATORS DEFINING A PROPOGATION ZONE AND AN EXCITER PLACED RELATIVE TO THE APPLICATOR

FIELD OF THE INVENTION

The present invention relates to the general technical field of using microwaves to produce a plasma from a gaseous medium of any kind.

More precisely, the invention relates to the field of producing plasma by microwaves, either in a magnetic field at electron cyclotron resonance, or in the absence of a magnetic field for high pressure plasmas.

Particularly advantageous applications of the invention lie in the field of surface treatments (etching, deposition, cleaning, disinfection, decontamination, spraying, ion implantation, chemical or thermochemical treatment), or in producing beams of ions obtained by plasma extraction, or in general, for the purpose of any other application where there is a requirement for a dense plasma to be produced.

BACKGROUND OF THE INVENTION

Numerous plasma-producing devices are known in the state of the art. For example, French patent FR 85/08 836 describes a technique for plasma excitation at electron cyclotron resonance. Electron cyclotron resonance is obtained when the frequency of gyration of an electron in a magnetic field that is static or quasi-static is equal to the frequency of the applied accelerating electric field. Resonance is obtained for a magnetic field B and an excitation frequency f given by the relationship:

$$B = (2\pi m f)/e$$

where m and e are respectively the mass and the charge of an electron. By way of example, at a frequency of 2.45 GHz, a magnetic field of 0.0875 Teslas is required to obtain resonance.

For plasma excitation, electron cyclotron resonance is possible only if electrons can be accelerated sufficiently by this process, i.e. if electrons can rotate long enough in phase with the electric field to acquire the threshold energy required for ionizing the gas. To achieve this, it is necessary firstly for the radius of gyration to be small enough, in particular to remain within the region of space in which the conditions for resonance are united, i.e. a region in which the applied electric field and the magnetic field of intensity B are present simultaneously, and secondly for the frequency of gyration to remain large compared with the frequency of elastic collisions between electrons and neutral elements, i.e. atoms and/or molecules. In other words, the best conditions for plasma excitation at electron cyclotron resonance are obtained when the gas pressure is low enough and simultaneously the electric field frequency f is high enough, i.e. also for a high magnetic field intensity B. In practice, in a conventional plasma, conditions favorable to excitation at electron cyclotron resonance are obtained for frequencies f at about or greater than 500 MHz and for gas pressures of about $10^{-1}$ Pascals, typically $10^{-3}$ Pascals to 10 Pascals, depending on the nature of the gas. Nevertheless, microwave frequencies greater than 10 GHz requires very high magnetic field intensities that cannot be obtained with conventional magnetic structures and permanent magnets. At the frequency f=2.45 GHz, the intensity B is 0.0876 Teslas, and it exceeds 0.35 Teslas at the frequency f=10 GHz.

As can be seen more clearly in FIG. 1, the technique described in the above-mentioned French patent requires, the use of permanent magnets 1 each creating at least one surface 2 of constant magnetic field of an intensity that corresponds to electron cyclotron resonance. Electromagnetic power is conveyed to the resonance zone 2 by antennas 3 or plasma exciters, each constituted by a metal wire element. Each exciter 3 overlies permanent magnets 1 which are mounted on the wall of a sealed enclosure 4.

Both the electromagnetic field and the magnetic field of intensity equal to the value that gives resonance are localized and confined essentially in the space situated between an exciter 3 and the portion of the enclosure wall that overlies a magnet. In the presence of a gaseous medium at low pressure, electrons are accelerated in the resonance zone and they wind around magnetic field lines 5 which define a plasma confinement surface. These field lines 5 form festoons connecting the pole of a magnet to the poles of adjacent magnets. Along its path, an electron dissociates and ionizes the molecules and atoms with which it comes into collision. Plasma is then produced along the field lines and subsequently diffuses from the field lines so as to form a cold plasma that is practically free of energetic electrons which remain trapped in the festoons. A major drawback of such a device is that microwave energy propagation and the resonance zone in which microwave energy is absorbed are superposed. It is therefore not possible for microwaves to propagate along the wire applicator without absorption taking place simultaneously. Therefore, both plasma density and microwave electric field intensity decrease progressively along the antenna. As a result, a plasma is obtained which has non-uniform density along the antenna, and which is consequently unsuitable for most industrial applications.

To remedy this drawback, patent FR 91/00 894 proposes placing the antenna 3 in an inter-magnet zone 6 lying between the wall of the enclosure and the magnetic field lines 5 interconnecting two adjacent poles of different polarities. The zone 6 is particularly propitious for microwave propagation since it is practically free of plasma since plasma diffusion is normal to the field lines and is considerably reduced when the intensity of the magnetic field increases. Standing waves of constant amplitude are thus obtained all along the microwave applicator with minima and maxima of microwave power every half-wavelength. However, even if the microwave power along the applicators is thus uniformly distributed on average, the plasma source is actually made uniform because of the existence of electron drift along the applicators due to the gradient and to the curvature of the magnetic field close to the magnetic field applicators. A uniform plasma can thus be produced along the applicator.

A major drawback of that technique is that the zones where the microwave electric field is at a maximum, i.e. between the applicator and the wall of the enclosure, do not coincide with the resonance zones where the intensity of the magnetic field is equal to electron cyclotron resonance. In order to produce plasma excitation, it is necessary either to increase the intensity of the applied microwave electric field, or else to increase the intensity of the magnetic field to extend the resonance zone. In which case, it is necessary to use permanent magnets capable of delivering very high magnetic field intensities that are considerably greater than those required merely for satisfying conditions of resonance.

In addition, all of the techniques described by the above two patents also suffer from the following drawbacks:

a low percentage of working volume for the magnetic field produced by the permanent magnets;

the need to position the microwave applicators very accurately relative to the magnets;

the need to provide the chamber with walls that are very thin given the very rapid decrease in magnetic field intensity as a function of distance from the surface of the magnet;

the need to use magnetic field applicators that are capable of delivering a magnetic field along the microwave applicator which is as uniform as possible so as to avoid impedance breaks that are extremely unfavorable to the propagation of microwaves along the applicator;

the near impossibility of pumping and distributing gases through the plasma excitation structure; and poor efficiency of excitation, and pulverization of the walls due to ions which diffuse with the fast electrons that create the plasma and are lost against the walls because of electron drift due to the gradient and to the curvature of the magnetic field (magnetron effect).

OBJECTS AND SUMMARY OF THE INVENTION

The invention therefore seeks to remedy the various drawbacks of the prior techniques by proposing a device suitable for ensuring propagation and distribution of microwave power with a minimum of losses along the length of the magnetic field applicator, so as to obtain maximum microwave power making it possible to achieve plasma density that is practically constant, at least on average.

The invention seeks to provide a plasma production device adapted to enable an increase in microwave power without any purely physical limitation, thereby making it possible simultaneously to increase the density of said plasma.

To achieve these objects, the distribution device for distributing microwave power to excite a plasma inside an enclosure comprises:

a source of microwave energy;

at least one first applicator of microwave energy; and at least one wire-shaped plasma exciter placed at a distance from the first microwave applicator to define between them an absorption zone, electrons being accelerated by the microwave field along determined trajectories.

According to the invention, the distribution device includes at least one second applicator of microwave energy to co-operate with a first applicator and an exciter to form at least one excitation triplet in which firstly the first applicator and the second applicator are mounted substantially parallel to each other and are spaced apart by a given amount to define between them a propagation zone for microwave energy, and secondly the exciter is disposed inside the enclosure by being placed relative to the first and second applicators in such a manner that the trajectories of the electrons do not cross the propagation zone, thereby dissociating the propagation zone and the absorption zone.

BRIEF DESCRIPTION OF THE DRAWINGS

Various other characteristics appear from the following description given with reference to the accompanying drawings which show embodiments and implementations of the invention as non-limiting examples.

MORE DETAILED DESCRIPTION

Figure 2:
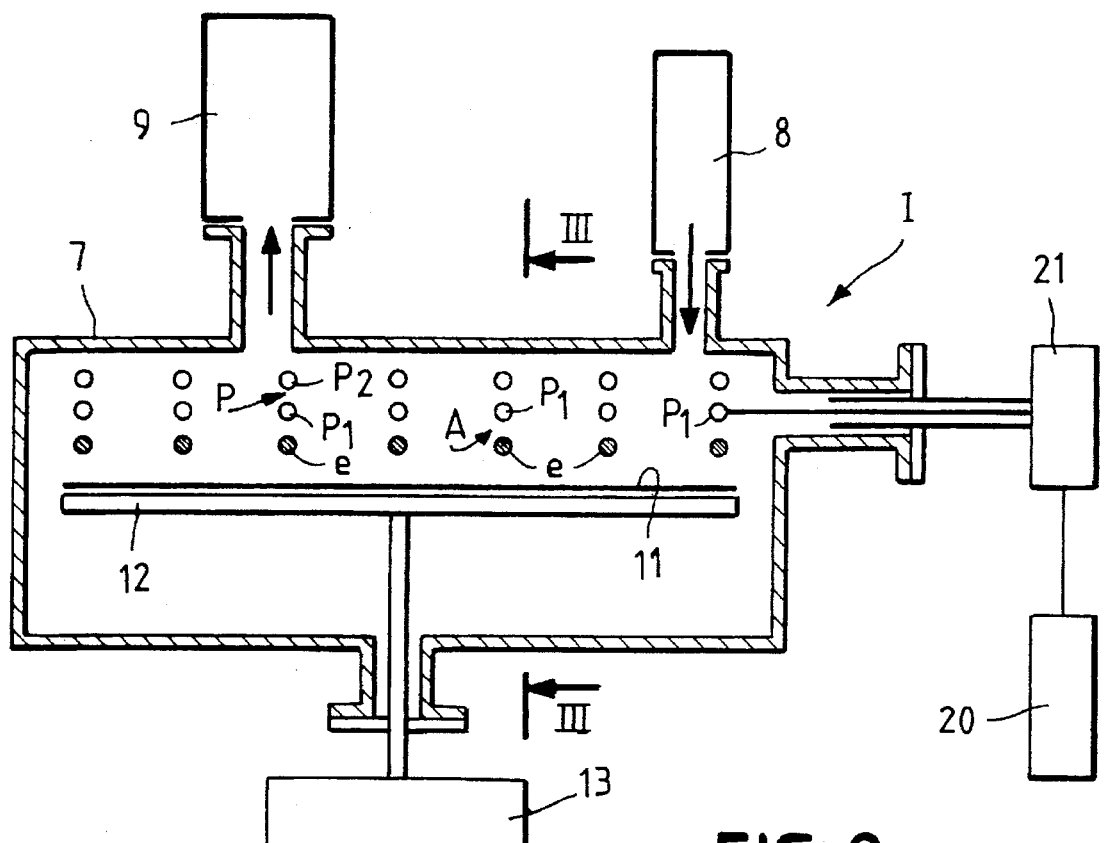
FIG. 2 is a diagram of a machine for producing plasma that implements an embodiment of a device for distributing microwave energy in accordance with the invention.
Figure 3:
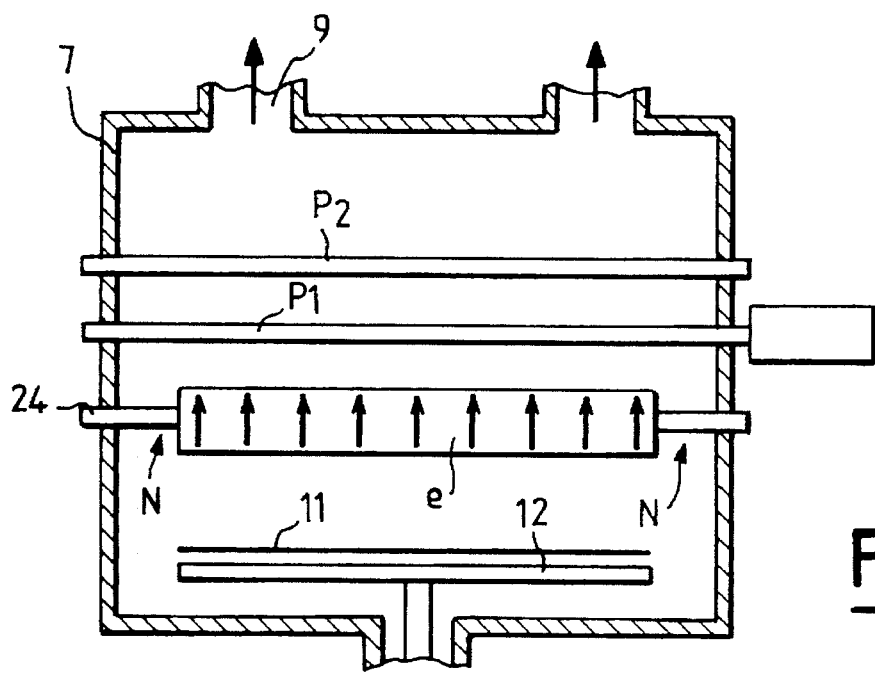
FIG. 3 is a section view substantially on lines III—III of FIG. 2.

As can be seen in FIGS. 2 and 3, the machine I is adapted to produce a plasma from a gaseous medium of any kind for a very wide range of applications, such as surface treatments or producing ion beams. The machine comprises a non-magnetic sealed enclosure 7 fitted with at least one device 8 for injecting gas and at least one device 9 for pumping gas, enabling the gas to be ionized to be maintained at a desired pressure across the excitation zone, which pressure may be about $10^{-2}$ Pascals to a few Pascals, for example. The machine I also includes a device of the invention for exciting the plasma which is confined in a central zone of the enclosure. For example, in the working zone, the plasma serves to perform surface treatment on a sample or substance 11 placed on a support 12 and biassed relative to the potential of the plasma by means of a generator 13.

Figure 1:
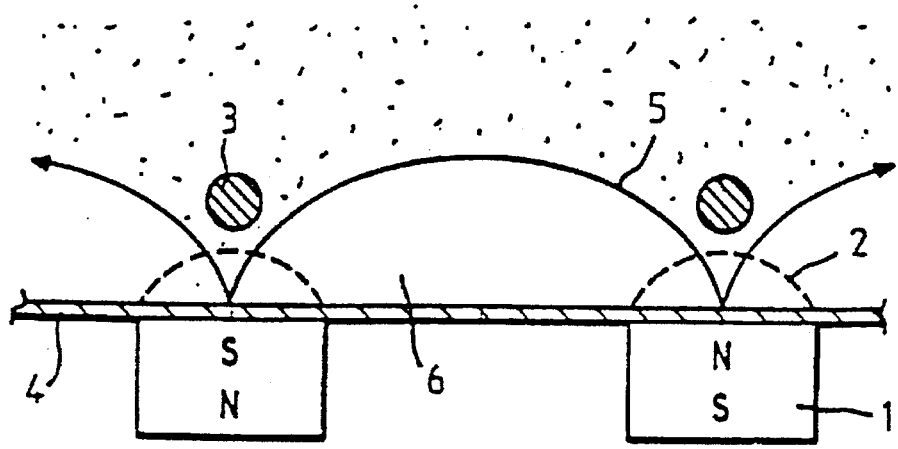
FIG. 1 is a diagrammatic section view through a prior art device for distributing microwave energy.
Figure 4:
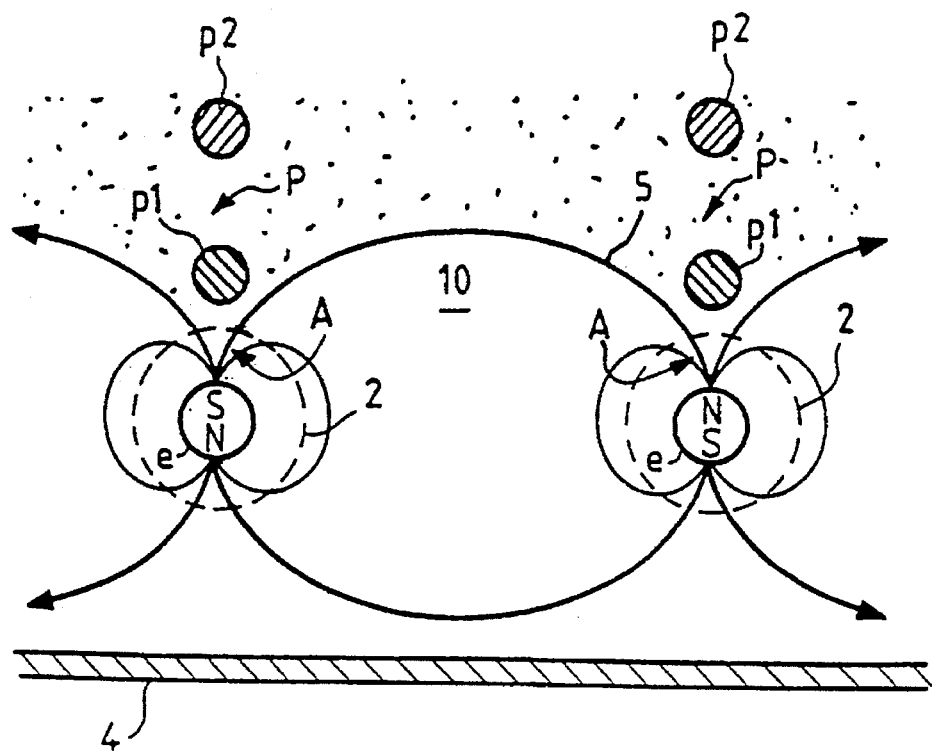
FIG. 4 is a view on a larger scale showing a unit distribution device in accordance with the invention.

The excitation device of the invention includes at least one plasma exciter e which, in a first embodiment, constitutes an element for applying a magnetic field using either permanent magnets or electrical currents travelling along conductors or superconductors. In the example shown, the excitation device comprises a series of exciters e each constituted by a permanent magnet that is wire-shaped and together forming a multi-pole magnetic structure. As can be seen more clearly in FIGS. 2 and 4, the magnetic exciters e which extend substantially parallel to one another present alternate polarities in succession to the plasma so as to constitute a magnetic surface 5 that is present in the form of magnetic field line festoons. The magnetic exciters e are positioned in such a manner that the magnetic field lines in the form of festoons connect the pole of one magnet to its own opposite pole or to the opposite pole of a consecutive magnet. Plasma production is thus confined in the zone 10 within the magnetic field line festoons 5.

In a preferred embodiment, the multi-pole magnetic structure is made so as to obtain a magnetic field of sufficient intensity to ensure electron cyclotron resonance. As can be seen more precisely in FIG. 4, each exciter e is suitable for creating a surface 2 at constant magnetic field and of intensity corresponding to electron cyclotron resonance. This surface 2 envelops each magnet e partially or totally, as shown by dashed lines in FIG. 4. For example, for an excitation frequency of 2.45 GHz, the magnetic field must be 0.0875 Teslas, and for an excitation frequency of 5.8 GHz, the intensity of the magnetic field must be 0.207 Teslas.

The exciters e are placed inside the enclosure 7 at a given distance from the walls of the enclosure firstly to enable gases to be pumped from said walls and secondly to enable electrons accelerated to electron cyclotron resonance to oscillate along the magnetic field lines and to drift perpendicularly to the magnetic field and to the gradient or curvature of the magnetic field. The exciters e are thus placed so that the electron trajectories which wind around the magnetic field lines are not intersected by the walls of the enclosure.

The excitation device of the invention also includes at least one, and in the example shown a series of first applicators $p_1$ for applying energy in the microwave range, which applicators are placed in a given localized region. The first applicators $p_1$ are connected by any appropriate means to a generator 20 of microwave energy via an impedance matcher 21. Each first applicator $p_1$ is placed at a predetermined distance from the exciter e so as to define therebetween an absorption zone A in which electron acceleration takes place. To this end, plasma excitation requires electrons to be sufficiently accelerated in this absorption zone A to excite the plasma, and thus requires both the microwave electric field and the magnetic field to be of sufficient intensity. The electrons accelerated in this way produce the plasma along their trajectories which follow the field lines 5. In the example shown in FIG. 4, plasma excitation is performed at electron cyclotron resonance.

Each first applicator $p_1$ preferably comprises a first wire element fed at one of its ends either via an evacuated coaxial passage, or via a waveguide-to-coaxial transition, or else via a cavity-to-coaxial transition. When the first applicator $p_1$ is implemented as a wire element, each absorption zone A is situated along the applicator $p_1$ between the applicator and the correspondingly located magnet e.

According to the invention, the excitation device also includes at least one, and in the example shown a series of second applicators $p_2$ of microwave energy, each placed at a predetermined distance from a first applicator $p_1$. Insofar as coupling takes place between the adjacent first and second applicators $p_1$ and $p_2$, each second applicator $p_2$ thus co-operates with the first applicator $p_1$ placed in proximity thereto to define a microwave power propagation zone P. In the example shown, each exciter e is placed so as to extend substantially parallel to the applicators $p_1$ and $p_2$. It should be observed that the exciter e may be placed in a position that is different relative to the applicators $p_1$ and $p_2$. Thus, the exciter e may be placed perpendicularly to the applicators $p_1$ and $p_2$. In more general manner, provision may be made to place an array of exciters e perpendicularly to an array of applicators $p_1$ and $p_2$. The excitation device of the invention includes at least one, and in general a series of triplets of excitation elements, each triplet comprising an exciter e, a first applicator $p_1$, and a second applicator $p_2$. In each triplet, the second applicator $p_2$ and the first applicator $p_1$ are placed relative to the exciter e in such a manner that the trajectories of energetic electrons do not cross the microwave power propagation zone P. In conventional manner, energetic electrons wind around the magnetic field lines 5. The applicators $p_1$ and $p_2$ of each triplet must thus be placed so that the trajectories 5 of energetic electrons do not cross the propagation zone P. In this way, it is possible to dissociate each propagation zone P from the associated absorption zone A, thereby enabling good microwave energy propagation all the way along the exciter.

The exciters e are placed in such a manner that the trajectories of the electrons winding around the magnetic field lines encounter no obstacles and are not intercepted, in particular by the walls of the enclosure. To this end, the exciter e must be situated at a distance from the walls of the enclosure along its length and at at least one of its end portions, particularly when using diametral magnetization as shown in FIG. 3. In this variant embodiment, the exciter e is of finite length shorter than the size of the enclosure 7 so as to leave a non-excitation zone N between at least one and preferably at both end portions of the exciter e and the walls of the enclosure 7. For exciters e of great length, each magnet e is extended at each of its end portions by a segment 24 for mounting it on the walls of the enclosure.

By mounting the exciter e inside the enclosure, it is possible to dispense and pump gases relative to the excitation zone via one or more locations, as can be seen in FIG. 3. Such a configuration also makes it possible to have an excitation structure capable of being adapted to the shape of the substances 11 to be treated (plane or cylindrical). In particular, it appears possible to place the exciter e at the desired distance from the substance.

To enhance microwave propagation outside the excitation zone A it is necessary in each triplet for the first applicator $p_1$ and the second applicator $p_2$ to be sufficiently close together so that maximum power propagation takes place preferentially between them. In general, the distance between the applicators $p_1$, $p_2$ of each triplet must be of the same order as and if possible equal to or less than the distance between each applicator $p_1$, $p_2$ and the exciter e.

In the example shown, it should be observed that the microwave source 20 is connected to the first applicators $p_1$. Naturally, it will be possible to connect the microwave source 20 directly to the second applicators $p_2$, or to the excitation applicators e, with maximum power propagation always being ensured by the applicators $p_1$, $p_2$. The microwave source 20 is preferably connected to one of the two applicators $p_1$, $p_2$ to avoid preferential excitation at the end of the excitation applicator e and to obtain uniform plasma production all along the exciter. It should also be considered that one or the other of the applicators $p_1$, $p_2$ may be constituted by a portion of the wall of the enclosure 7.

Figure 5:
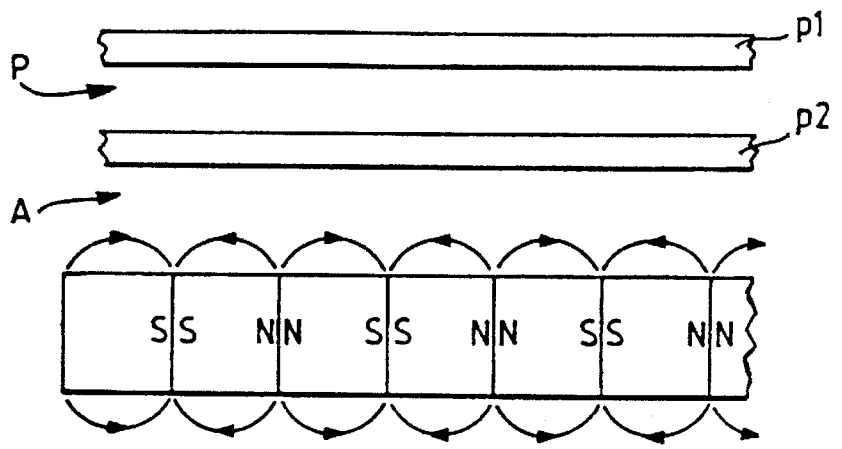
FIG. 5 shows an embodiment of excitation applicators suitable for being implemented in the device of the invention.
Figure 6:
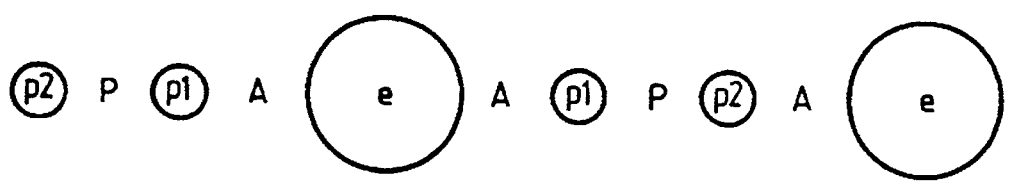
FIGS. 6 to 8 show various combinations in which the excitation device of the invention can be implemented.
Figure 7:
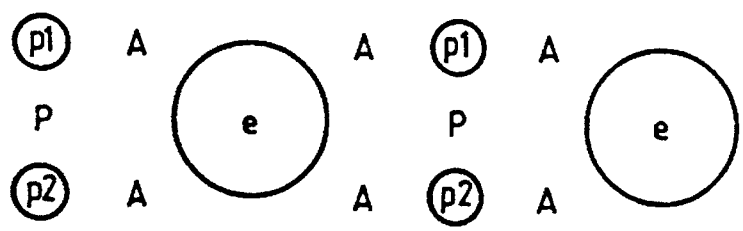
Figure 8:
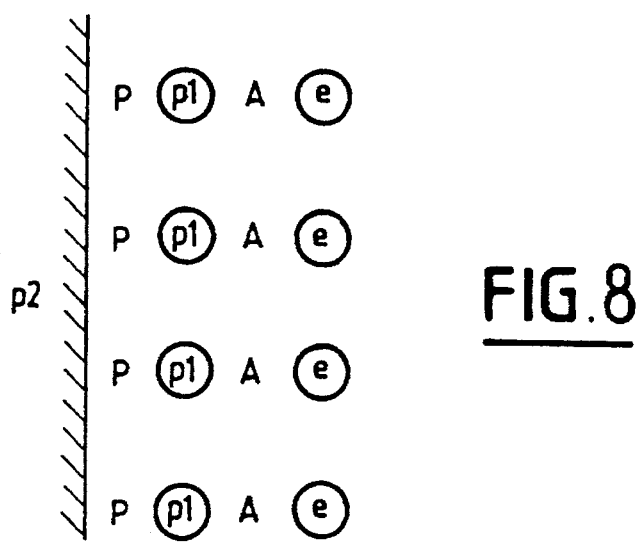

In addition, when the excitation applicators e are implemented in the form of permanent magnets, various permanent magnet structures may be used. Thus, for example, it is possible to envisage using a magnetic applicator of the wire type having continuous diametral magnetization (FIG. 3) or a wire applicator having an alternating magnetic structure using magnets having axial magnetization (FIG. 5). In general, the exciter e and the applicators $p_1$, $p_2$ may be of arbitrary shapes and sections and, if necessary, they may be internally cooled by means of channels for conveying a circulating cooling fluid, which channels are provided inside the exciters and/or the applicators.

It should be observed that the applicators and/or the exciters may also serve to dispense gas, photons, additional electrons, radiation, etc. Similarly, it may be advantageous to surround the applicators $p_1$, $p_2$ by a dielectric case in order to isolate the device electrically or thermally relative to the outside or to avoid any risk of metallic contamination, or even to ensure better propagation, without loss of microwave power along the applicators in the presence of a plasma.

The excitation device of the invention may be used in applications that require a single excitation triplet. It may naturally be used with a series of triplets associated so as to produce large areas of plasma having dimensions and configurations that are very varied (plane, cylindrical, head to tail, . . . ) or to co-operate with the magnetic field supplied by the excitation applicators to perform a multi-pole magnetic confinement structure, as shown in FIG. 2. As non-limiting examples, FIGS. 6 to 9 show various combinations in which the propagation applicators $p_1$, $p_2$ or the exciters e may be common with adjacent devices or consecutive. In all cases, the propagation zone P and the absorption zone A must be separate spatially, as explained above.

Figure 9:
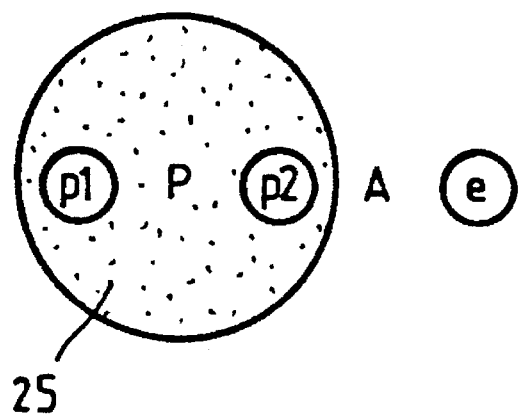
FIGS. 9 and 10 are diagrams showing the principle whereby the excitation device of the invention is implemented in a second variant embodiment.
Figure 10:
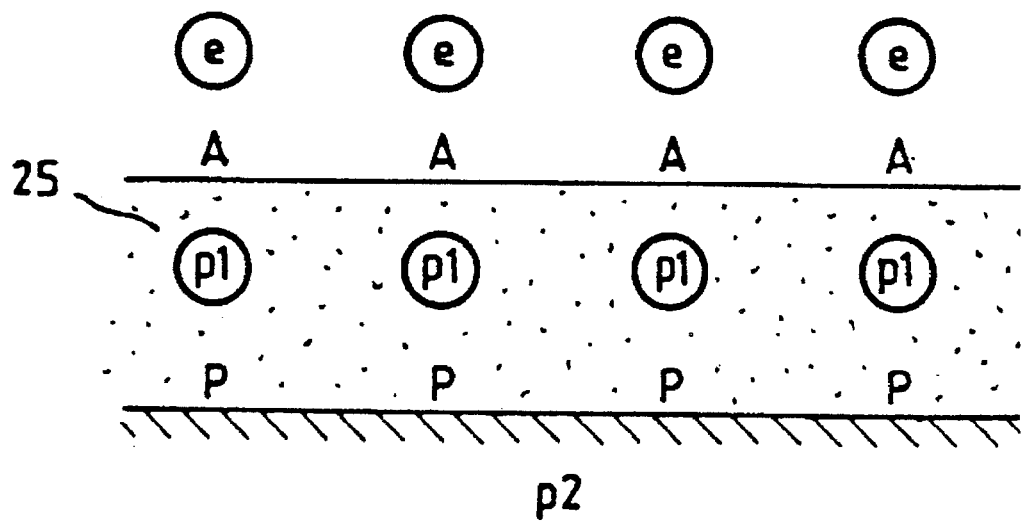

FIGS. 9 and 10 show a second variant embodiment of the excitation device of the invention, for implementation at high pressures or for high microwave power.

At high pressure or at high microwave power, in order to avoid discharging or plasma ignition in the special propagation zone P where the electric field is the highest, it is proposed to fill the propagation zone P with a dielectric material 25 that exhibits low loss. Discharging then takes place in the so-called excitation zone A. At high pressure where electron cyclotron resonance is no longer possible because of elastic collisions on neutral bodies being too frequent, the magnetic field loses its effectiveness and the excitation applicators e may be reduced to simple wire applicators similar to the propagation applicators.

Amongst the advantages provided by the invention, mention should be made of those that enable the problems posed by the prior art techniques to be remedied, and in particular all problems associated with microwave propagation along the plasma excitation device. In the invention, the use of three wire applicators makes it possible to separate in space the propagation of microwaves and the excitation of plasma, thereby avoiding impedance discontinuities associated with large local non-uniformities in the magnetic field and thus in the plasma. In addition, the invention permits wider flexibility in use, in particular in selecting reactor configurations, magnetic structures, and over an accessible range of pressures (typically $10^{-3}$ Pascals to $10^3$ Pascals or more). Another decisive advantage is the effectiveness of the device since there are no purely physical limitations that put a limit on increasing the microwave power propagating along the propagation applicators, and thus simultaneously increasing the density of the plasma. Another advantage of the invention lies in the fact that it is possible to increase pumping speed in proportion to the dimensions of the substance 11 to be treated, as can be seen from the example shown in FIG. 3. Furthermore, very good excitation efficiency can be obtained by using magnets placed in the inside volume of the enclosure, each of which, on its own or with its neighbors, may constitute three-dimensional magnetrons.

The invention is not limited to the examples described and shown since various modifications can be applied thereto without going beyond its ambit.

I claim:

1. A distribution device for distributing microwave power to excite a plasma inside an enclosure, the device comprising:

a source of microwave energy;

at least one first applicator of microwave energy; and at least one wire-shaped plasma exciter placed at a distance from the first microwave applicator to define between them an absorption zone, electrons being accelerated by the microwave field along determined trajectories;

wherein the distribution device includes at least one second applicator of microwave energy to co-operate with a first applicator and an exciter to form at least one excitation triplet in which firstly the first applicator and the second applicator are mounted substantially parallel to each other and are spaced apart by a given amount to define between them a propagation zone for microwave energy, and secondly the exciter is disposed inside the enclosure by being placed relative to the first and second applicators in such a manner that the trajectories of the electrons do not cross the propagation zone, thereby dissociating the propagation zone and the absorption zone.

2. A device according to claim 1, wherein the first and second applicators of the same triplet are placed in such a manner that the distance between them is equal to or less than the distance between each of the applicators and the associated exciter.

3. A device according to claim 1, wherein the plasma exciter creates a magnetic field at the electron cyclotron resonance frequency.

4. A device according to claim 1, wherein the propagation zone for microwave energy defined between the first and second applicators is filled with a dielectric material to prevent the plasma discharging in said zone at high pressures or at high microwave powers.

5. A device according to claim 1, wherein each of the applicators is constituted by a wire element.

6. A device according to claim 1, wherein at least one of the applicators of a triplet is constituted by a wall of a sealed enclosure.

7. A device according to claim 1, wherein each of the applicators is constituted by a wire element, and wherein the microwave energy source is connected to any of the wire elements constituting an excitation triplet.

8. A device according to claim 1, wherein both applicators are mounted inside the enclosure.

9. A device according to claim 1, wherein the exciter is mounted substantially parallel to the applicators.

10. A device according to claim 1, wherein the exciter is of finite length shorter than the size of the enclosure so as to leave a non-excitation zone between the enclosure and at least one end portion of the exciter.

11. A device according to claim 1, wherein the plasma exciter has a structure that is magnetized with magnetization that is radial, axial or diametral, continuous or alternating.

12. A deice according to claim 1, including a series of exciters placed relative to one another in such a manner as to form a multi-polar magnetic structure.

13. A plasma production machine of the type comprising a sealed enclosure connected to at least one pumping device and to a device for feeding a gaseous medium so as to maintain a determined pressure inside the enclosure, the machine including at least one device according to claim 1.

* * * * *